United States Patent [19]

Morcom et al.

[11] Patent Number: 4,700,345
[45] Date of Patent: Oct. 13, 1987

[54] DOWNSAMPLING AND PREFILTER IMPLEMENTATION IN TELEVISION SYSTEMS

[75] Inventors: Richard Morcom; Terence R. Hurley, both of Hampshire, United Kingdom

[73] Assignee: Independent Broadcasting Authority, London, England

[21] Appl. No.: 700,709

[22] PCT Filed: Jun. 4, 1984

[86] PCT No.: PCT/GB84/00193
§ 371 Date: Feb. 4, 1985
§ 102(e) Date: Feb. 4, 1985

[87] PCT Pub. No.: WO84/05001
PCT Pub. Date: Dec. 20, 1984

[30] Foreign Application Priority Data
Jun. 3, 1983 [GB] United Kingdom ............... 8315373

[51] Int. Cl.[4] ............... H04J 15/00; H04N 9/64; H04N 7/12
[52] U.S. Cl. ............... 370/118; 358/36; 358/37; 358/138; 358/166; 364/724; 364/825
[58] Field of Search ............... 370/118, 123; 358/31, 358/36, 37, 166, 133, 138; 364/724, 825; 381/29, 31; 375/122

[56] References Cited

U.S. PATENT DOCUMENTS

| | | | |
|---|---|---|---|
| 4,035,628 | 7/1977 | Lampe et al. | 364/825 |
| 4,223,341 | 9/1980 | Drewery | 358/36 |
| 4,242,705 | 12/1980 | Ebihara | 358/36 |
| 4,322,810 | 3/1982 | Nakayama | 364/724 |
| 4,510,522 | 4/1985 | Pritchard et al. | 358/37 |
| 4,524,423 | 6/1985 | Acampora | 364/724 |

OTHER PUBLICATIONS

Gooding, et al., Development of a CCD Programmable Transversal Filter; Colloquium on Modern Signal Processing Technology for Sonar, London, Eng., 11/16/78.

Gooding, et al., A CCD Based Programmable Transversal Filter; Fifth European Solid State Circuits Conference, ESSCIRC 79, Southampton, Eng., 9/18-21/79.

*Primary Examiner*—Benedict V. Safourek
*Assistant Examiner*—M. Huseman
*Attorney, Agent, or Firm*—Watson Cole Grindle & Watson

[57] ABSTRACT

A filter for filtering analog or digital samples using two sections, each including a multiplier stage having a plurality of multiplier sections, each with a respective output but a common input for applying a plurality of coefficients to a sample input to the multiplier stage, and a delay and summing network comprising a plurality of delay sections and alternate summing networks connected in series, the output of one of the multiplier sections being connected to the first delay sections in the series with each output of the other multiplier sections being connected to a respective summing network, the delay and summing network of one section being interleaved in series with the delay and summing network of the other section, and further comprising means for omitting alternate samples.

2 Claims, 8 Drawing Figures

DOWNSAMPLING AND PREFILTER IMPLEMENTATION IN TELEVISION SYSTEMS

BACKGROUND OF THE INVENTION

1. Field of the Invention

The present invention relates to data transmission systems in which the data is in the form of analogue or digital samples.

2. Related Art

In sampled systems, transmission bandwidth can be reduced by downsampling. This, in its simplest form, involves dropping samples to reduce the number transmitted. Where more than one sample stream is to be transmitted, downsampling and then multiplexing sample streams can reduce the number of channels required. If two such streams are downsampled by dropping alternate samples and then multiplexed by interleaving samples, the resultant sample rate is the same as in one of the original streams.

SUMMARY OF THE INVENTION

The present invention provides a filter for filtering a signal in the form of analogue or digital samples, comprising a multiplier stage having a plurality of multiplier sections each with a respective output but a common input for applying a plurality of coefficients to a sample input to the stage, and a delay and summing network comprising a plurality of delay sections and alternate summing networks connected in series, the output of one of the multiplier sections being connected to the first delay section in the series with each output of the other multiplier sections being connected to a respective summing network.

BRIEF DESCRIPTION OF THE DRAWINGS

Features and advantages of the present invention will become apparent from the following description of embodiments thereof when taken in conjunction with the accompanying drawings, in which.

DETAILED DESCRIPTION OF THE PREFERRED EMBODIMENT

Figure 1:
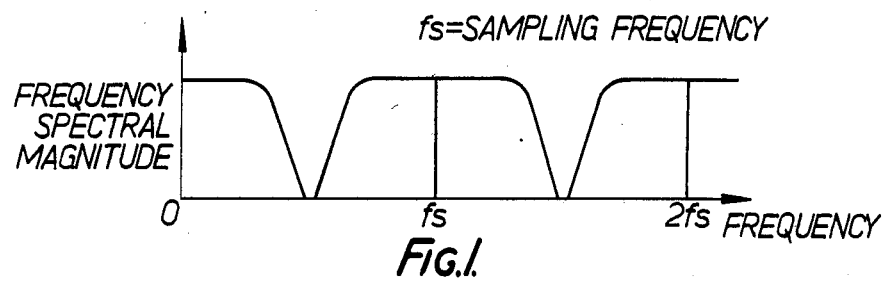
FIG. 1 is a diagram showing the frequency spectrum of a sampled signal.
Figure 2:
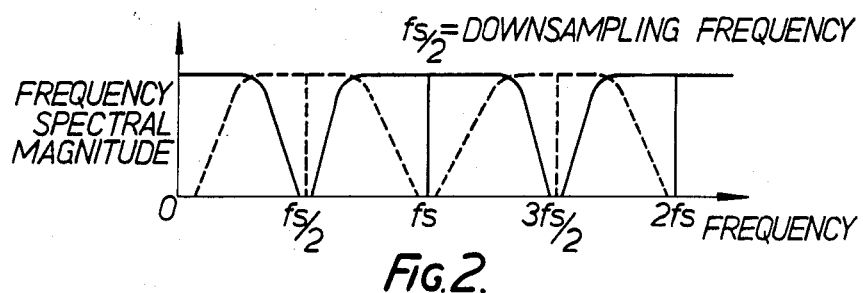
FIG. 2 is a diagram showing the frequency spectrum of a downsampled signal.

The frequency spectrum of a sampled system is outlined in FIG. 1. The spectrum has repeats at intervals which are multiples of the sampling frequency. Downsampling introduces spectrum repeats at multiples of the downsampled frequency. Downsampling to half the sampling frequency introduces repeats at half the sampling frequency as shown in FIG. 2. The repeat spectra can overlap to cause aliasing which cannot be removed by simple means.

Figure 3:
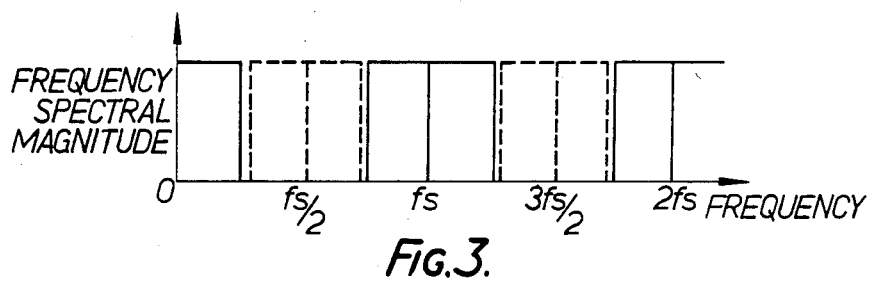
FIG. 3 is a diagram showing the frequency response of an ideal pre-filter.
Figure 4:
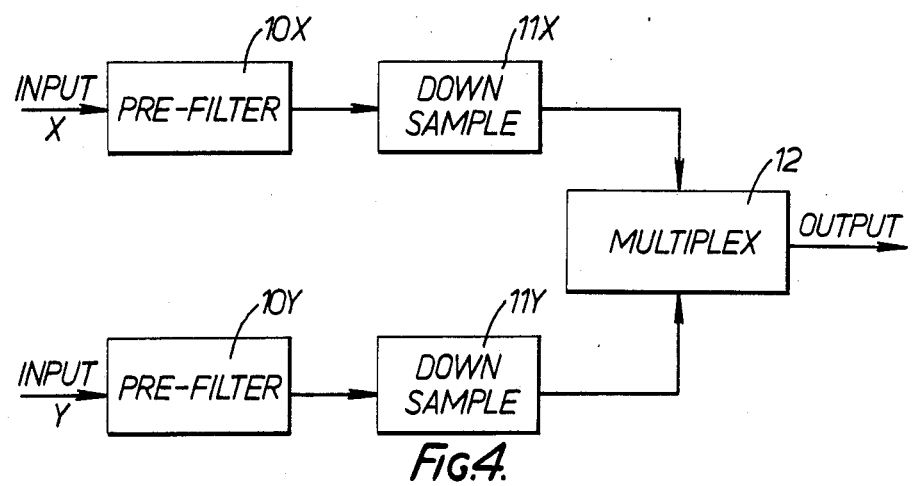
FIG. 4 is a block diagram of a basic form of a downsampling system with pre-filtering.

The aliasing can however be prevented or reduced by pre-filtering prior to downsampling. The ideal prefilter has an amplitude response which is a "brick-wall" as shown in FIG. 3. The cut-off frequency is at half the downsampled frequency. The simplest practical pre-filter is a two sample average which has coefficients of $\frac{1}{2}:\frac{1}{2}$. The frequency response of this pre-filter has a null at half the original sampling frequency and therefore reduces the alias but does not remove it. More complicated filters using more samples can improve the response.

Where two samples streams X and Y are to be identically filtered, downsampled and multiplexed by interleaving samples, the hardware can be implemented as shown in FIG. 4 by passing each sample stream X and Y at identical rates through respective pre-filters 10X and 10Y and thereafter through respective down sampling circuit 11X and 11Y. The downsampled streams are then multiplexed using a multiplexing circuit 12. Each pre-filter 10 is often implemented by the arrangement shown in FIG. 5 for a filter of N coefficients. The pre-filter comprises a succession of delay circuits 14, each having a delay period equal to the sample period of the data stream. The input of each delay circuit 14 is connected by a respective filter coefficient circuit 15 to an addition circuit 16, the output of which is the filtered output. The output of the last delay circuit 14 is also connected by a circuit 15 to the addition circuit 16. Note that two such pre-filters are required in the system.

Figure 5:
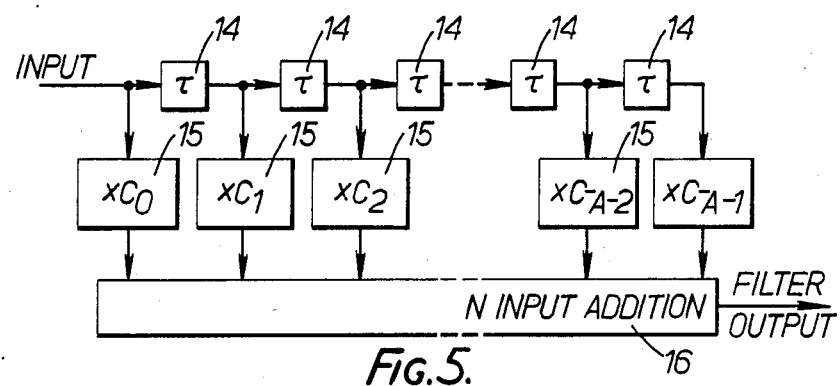
FIG. 5 is a block diagram of a pre-filter used in the system shown in FIG. 4.
Figure 6:
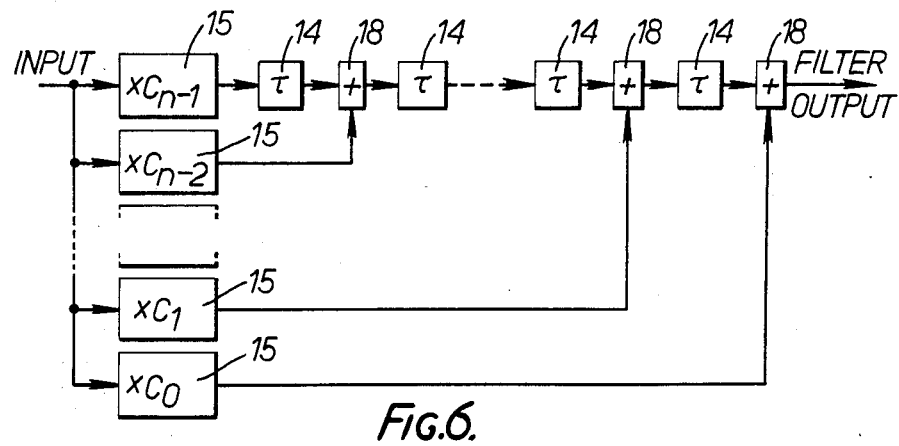
FIG. 6 is a block diagram of a pre-filter construction which can be used to replace the pre-filter shown in FIG. 5.
Figure 7:
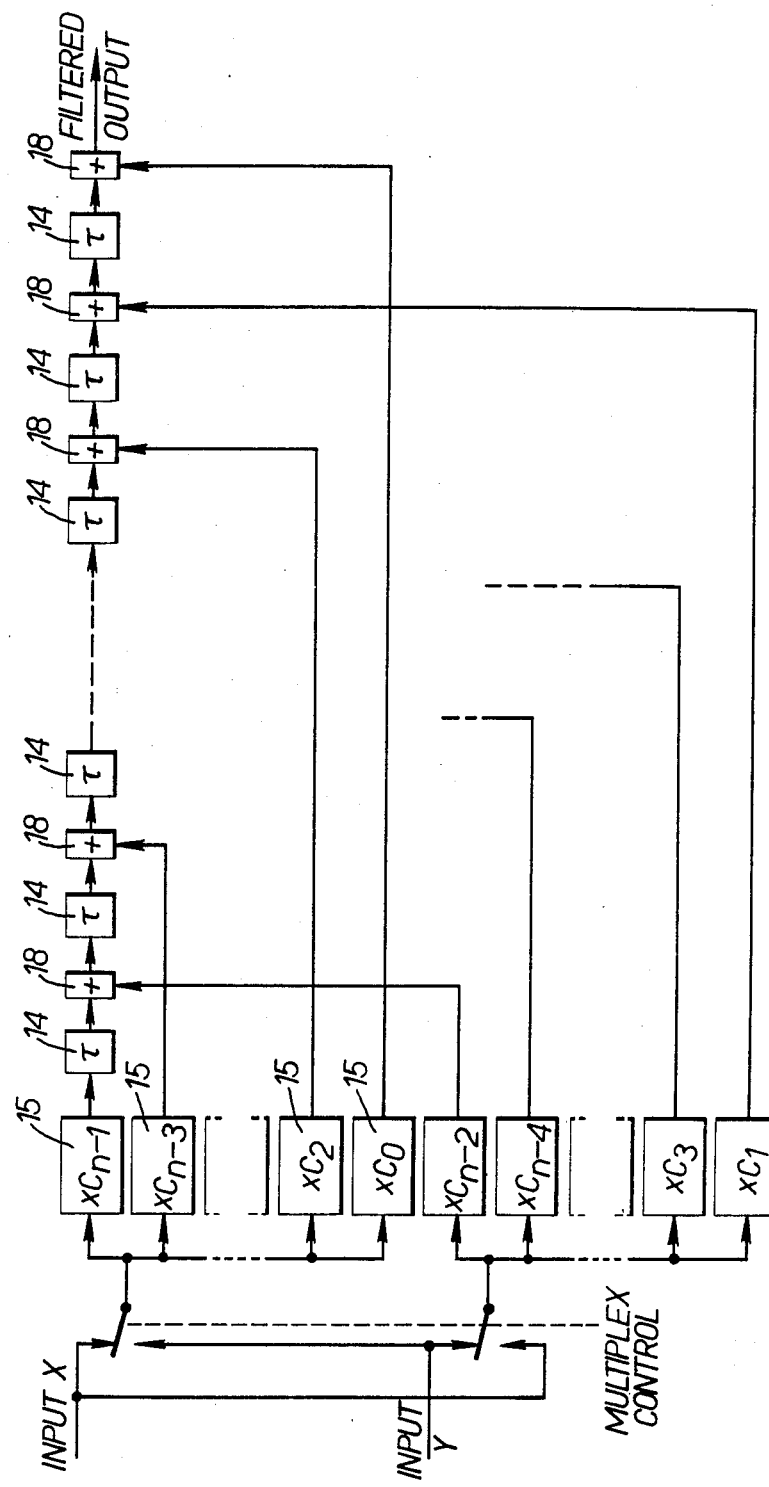
FIG. 7 is a block diagram of a pre-filter construction according to the present invention.

This implementation can however be improved, resulting in a reduction in hardware using a different technique. Consider implementing the filter using a pre-sum technique as in FIG. 6. The same reference numerals are used for the same parts as in FIG. 5. In this case however each sample as it appears at the input of the filter is fed to all of the n filter coefficient circuits 15 of which n−1 are connected to respective summation stages 18 connected at the outputs of the respective delay circuit 14. The $n^{th}$ circuit 15 is connected between the filter input and the input of the first delay circuit 14. The outputs of the filters shown in FIG. 5 and FIG. 6 are identical and thus the filter in FIG. 6 could be used in place of the filter in FIG. 5. This pre-sum arrangement lends itself to the situation where two sample streams are to be filtered, downsampled and multiplexed. This is because the system can be changed so that the sample streams are first multiplexed and downsampled in one operation into two separate streams. The resulting streams are filtered in one filter which has been split in two phases. The implementation is shown in FIG. 7 for a filter of n coefficients. FIG. 7 shows the whole system, including the multiplexing. Note the reduction in hardware, because only one filter is required. The same reference numerals are used for the same parts shown in FIG. 6 and hence no description will be given.

As an example, this technique can be used to implement the pre-filter used in the colour channels of the MAC system of coding television pictures.

Colour information is first coded as colour difference signals U and V. The U and V are then further coded by interleaving alternate lines to generate a single colour channel. This is a downsampling process which requires a pre-filter to reduce alias components. In this example the samples are lines of television picture which consist of streams of 8 bit wide bytes of data.

Other applications of this technique are for bit rate reduction in transmission systems and for digital video tape recording.

The pre-filter arrangement can be used to implement the filter disclosed in our co-pending International Application No. PCT/GB83/00022.

At a receiving station such as a domestic television receiving apparatus, the reverse operation to that shown in FIG. 7 will be carried out with interpolation to recreate the X and Y data streams. A block diagram of suitable receiving apparatus is shown in FIG. 8.

Figure 8:
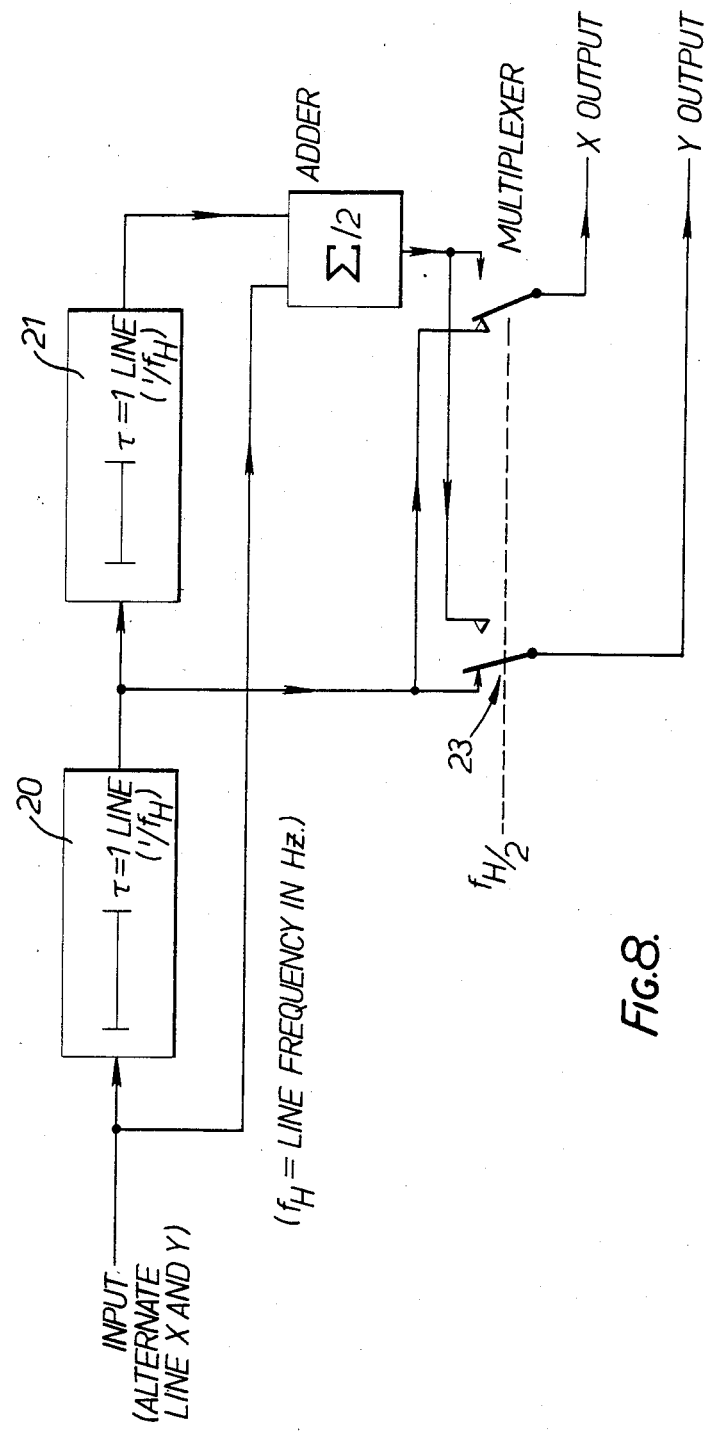
FIG. 8 is a block diagram of a part of receiving apparatus for receiving a signal that has been processed by the construction shown in FIG. 7.

In FIG. 8, the input to receiving apparatus comprises alternate samples from the X and Y data streams shown in FIG. 7. Each sample is fed through a first delay circuit 28 which delays the samples by a period equal to one line of video and the output of the delay circuit 20 is fed to a second, identical, delay circuit 21 and to a switching network 23. The output of the delay circuit 21 is fed to an adding circuit 22 where the sample instanteously present at the input to the delay circuit 20 is added to the sample from two lines previously and divided by a factor, in this case two, in order to produce an interpolated sample to replace the sample omitted by the downsampling operation prior to transmission.

The switching network 23 operates to recreate the X and Y data streams with each data stream comprising alternate real and interpolated samples. With one sample per line, the network operates at one half line frequency.

What is claimed is:

1. A filter for filtering signals in the form of analoque or digital samples, comprising two sections, each of which including a multiplier stage having a plurality of multiplier sections each with a respective output but a common input for applying a plurality of coefficients to a sample input of a selected one of the multiplier stages, and a delay and summing network comprising a plurality of delay sections and alternate summing networks connected in series, the output of one of the multiplier sections being connected to the first delay sections in the series with each output of the other multiplier sections being connected to a respective summing network, and the delay and summing network of one section being interleaved in series with the delay and summing network of the other section, and further comprising switching means for receiving two input signals in parallel and for alternately feeding and omitting samples to each stage from the two input signals.

2. Receiving apparatus for receiving a signal produced by the filter arrangement of claim 1, and comprising means for interpolating from two adjacent samples of the same type a sample equivalent to each omitted sample, and switching means operating at one half of the sample rate for reconstructing from transmitted and interpolated samples the two original input signals.

* * * * *